United States Patent
Kitahara (10) Patent No.: US 6,243,263 B1
(45) Date of Patent: Jun. 5, 2001

(54) HEAT RADIATION DEVICE FOR A THIN ELECTRONIC APPARATUS

(75) Inventor: Takashi Kitahara, Matsuda-machi (JP)

(73) Assignee: PFU Limited, Ishikawa (JP)

( * ) Notice: Subject to any disclaimer, the term of this patent is extended or adjusted under 35 U.S.C. 154(b) by 0 days.

(21) Appl. No.: 09/341,305

(22) PCT Filed: Nov. 12, 1998

(86) PCT No.: PCT/JP98/05086

§ 371 Date: Dec. 22, 1999

§ 102(e) Date: Dec. 22, 1999

(30) Foreign Application Priority Data

Nov. 12, 1997 (JP) .................................................. 9-310213

(51) Int. Cl.$^7$ ...................................................... H05K 7/20
(52) U.S. Cl. .......................... 361/695; 165/121; 165/122; 165/104.33; 165/80.3; 174/15.2; 361/700; 415/178; 417/423.17
(58) Field of Search ..................... 165/80.3, 80.5, 165/104.33, 121–122; 174/15.2; 361/687, 694–697, 700; 415/211.1, 213.1, 214.1, 175–178, 223; 417/423.7, 423.14; 454/184, 354

(56) References Cited

U.S. PATENT DOCUMENTS

| | | | |
|---|---|---|---|
| 5,421,402 | * 6/1995 | Lin | ........................................ 165/122 |
| 5,699,854 | * 12/1997 | Hong | .................................... 165/121 |
| 5,727,624 | * 3/1998 | Ko et al. | ............................... 165/121 |
| 5,864,464 | * 1/1999 | Lin | ........................................ 361/697 |
| 5,966,286 | * 10/1999 | O'Connor et al. | .................... 361/687 |
| 6,067,227 | * 5/2000 | Katsui et al. | .......................... 361/695 |

FOREIGN PATENT DOCUMENTS

| | | |
|---|---|---|
| 7-130924 | 5/1995 | (JP) . |
| 8-204077 | 8/1996 | (JP) . |
| 9-134233 | 5/1997 | (JP) . |

\* cited by examiner

*Primary Examiner*—Gregory Thompson (57) ABSTRACT

A heat radiation device for a thin electronic apparatus includes a rectangular plate-shaped base, a rectangular intermediate plate stacked on the base, a rectangular box-shaped cover stacked on the intermediate plate, and a fan. A depression is formed at a center portion of the base. A plurality of parallel fins are provided to form a discharge port for cooling air. The depression and the discharge port are connected via an arcuate communication portion. A circular opening is formed in the intermediate plate at a position corresponding to that of the depression, and the fan is attached to the circular opening. The intermediate plate and the base are connected together such that heat can be conduced therebetween. When the end surface of a side plate provided at each longer side of the cover is caused to abut the intermediate plate and/or the base, an intake port for cooling air is formed at a shorter side of the cover. When the fan is operated, cooling air is caused to flow between the intake port and the discharge port, so that heat accumulated within the base is radiated to the outside.

13 Claims, 5 Drawing Sheets

HEAT RADIATION DEVICE FOR A THIN ELECTRONIC APPARATUS

TECHNICAL FIELD

The present invention relates generally to a heat radiation device for a thin electronic apparatus, and more particularly, to a heat radiation device for a thin electronic apparatus which is adapted to radiate to the outside heat generated from a thin electronic apparatus such as an electronic apparatus having the size of a credit card and which is suitable for radiation of heat from a thin electronic apparatus accommodated within a limited space.

BACKGROUND ART

Recently, portable data processing apparatuses, such as laptop personal computers, have been improved in terms of processing performance and have been made thinner. Therefore, such a data processing apparatus incorporates a high performance CPU, which consumes much power and generates a great amount of heat. Therefore, there have been devised various methods for radiating to the outside heat from a heat source such as a high performance CPU. Meanwhile, improvements have been made to such a high performance CPU itself in order to cope with heat generation; e.g., employment of a low-power consumption mode and employment of a design that enables low-voltage drive.

Means for circulating cooling air by use of a fan has been the most commonly used method for radiating to the outside heat from a heat source such as a high performance CPU that constitutes the above-mentioned data processing apparatus. That is, outside air is taken into a heat radiation device attached to a heat source, is passed through the interior of the heat radiation device, and is discharged to the outside of the heat radiation device. However, since the heat radiation apparatus itself has a reduced thickness, cooling air does not flow smoothly through the interior of the heat radiation device. Since the non-smooth flow of cooling air decreases the cooling efficiency of the heat radiation device, heat from the heat source cannot be effectively radiated to the outside. Further, since the cooling air flows through a limited narrow space within the heat radiation device, a portion of air to be discharged is not discharged from the heat radiation device. That is, a portion of air that must be discharged to the outside is again taken into the interior of the heat radiation device, thus further decreasing the cooling efficiency.

Cooling performance can be improved through an increase in the flow rate of cooling air. However, since this measure requires an increase in the size of a fan, the overall thickness of the heat radiation device or the data processing apparatus cannot be decreased. Practically, since a space for accommodating a large fan cannot be secured in a thin heat radiation device and a thin data processing apparatus, the above-described measure cannot be employed.

An object of the present invention is to provide a heat radiation device for a thin electronic apparatus which can improve cooling efficiency without rendering difficult decreasing the thickness of a data processing apparatus.

SUMMARY OF THE INVENTION

A heat radiation device for a thin electronic apparatus according to the present invention comprises a rectangular plate-shaped base formed from a material having high heat conductivity, a rectangular intermediate plate formed from a material of high heat conductivity and stacked on the base, a rectangular box-shaped cover stacked on the intermediate plate, and a fan. A depression having a short cylindrical shape is formed at a center portion of the base. A plurality of parallel fins are projected from the bottom portion of the base along a first longer side thereof such that the fins extend in a direction perpendicular to the first longer side, whereby a second ventilation port is formed. A communication portion having an arcuate shape as projected on a plane is formed in order to connect the depression and the second ventilation port. A circular opening is formed in the intermediate plate at a position corresponding to that of the depression. A fan is attached to the circular opening. The intermediate plate and the base are connected together such that heat can be conduced therebetween. A downwardly projecting side plate is provided at each longer side of the cover. When the end surface of the side plate is brought into contact with the intermediate plate and/or the base, a first ventilation port for cooling air is formed at a shorter side of the cover, and a passage for cooling air is formed between the cover and the intermediate plate. When the fan is operated, cooling air is caused to flow between the first and second ventilation ports, so that heat accumulated within the base is radiated to the outside.

In the heat radiation device for a thin electronic apparatus according to the present invention, since cooling air is caused to flow at a high flow speed along a predetermined passage within the heat radiation device, heat can be efficiently taken in and discharged from a thin electronic apparatus including a heat source such as a high performance CPU that consumes a large amount of power and generates a large amount of heat. By virtue of the above-described structure, heat can be radiated efficiently from even a thin heat radiation device which has a reduced thickness and through which cooling air does not flow smoothly because of the reduced thickness. Especially, since the above-described structure of the heat radiation device increases the flow velocity of cooling air, a thin electronic apparatus, which may generate the largest amount of heat among various types of electronic apparatuses, can be efficiently cooled by air through forced flow of cooling air. Accordingly, a thin electronic apparatus can be effectively air-cooled without necessity of increasing the size of the fan of the heat radiation device. Also, the heat radiation device does not hinder an data processing apparatus from being made thinner.

In one preferred embodiment of the present invention, a first ventilation port is used as an intake port, and a second ventilation port is used as a discharge port. Cooling air is caused to flow from the first ventilation port to the second ventilation port through operation of the fan.

In another preferred embodiment of the present invention, the bottom surface of the base is used as a heat receiving portion, which is disposed above a heat source to face the heat source. This structure enables efficient conduction of heat from the heat source to the base, so that cooling efficiency is improved.

In still another preferred embodiment of the present invention, the bottom surface of the base serving as a heat receiving portion that faces the heat source is covered with a thin film of a material of high heat conductivity. When the base is formed of an aluminum alloy, a copper (Cu) layer and a nickel (Ni) layer are layered, in this sequence, on the bottom surface of the base. This structure enables efficient absorption of heat from a heat source to thereby further improve cooling efficiency.

In yet another preferred embodiment of the present invention, a groove having a semi-circular or U-shaped cross section is formed in the base, along a shorter side and a longer side thereof. A condensation portion of a heat pipe is accommodated within the groove in a heat conductible manner, and an evaporation portion of the heat pipe is connected to the heat source in a heat conductible manner. By virtue of this structure, when no space is secured above the heat source, heat from the heat source can be conducted to a heat radiation device provided in a large space within the data processing apparatus and is treated there. Accordingly, cooling efficiency can be improved, while the thinness of the overall data processing apparatus is secured.

In still another preferred embodiment of the present invention, insertion holes are formed in the intermediate plate, some or all of the fins provided on the base have insertion portions provided at their upper ends, and the insertion portions are fitted into the insertion holes. This structure promotes heat conduction between the base and the intermediate plate, so that occurrence of thermal saturation of the base is prevented in order to improve cooling efficiency.

In yet another preferred embodiment of the present invention, a wavy shape is formed on the surface of the depression of the base. The difference of height between the top and bottom of the wavy shape is preferably about 20% the clearance between the end surface of the fan and the surface of the depression. By virtue of the above-described structure, a pressure difference is produced in cooling air that flows along the surface of the depression facing the fan, thereby improving cooling efficiency.

DESCRIPTION OF THE PREFERRED EMBODIMENTS

Figure 1:
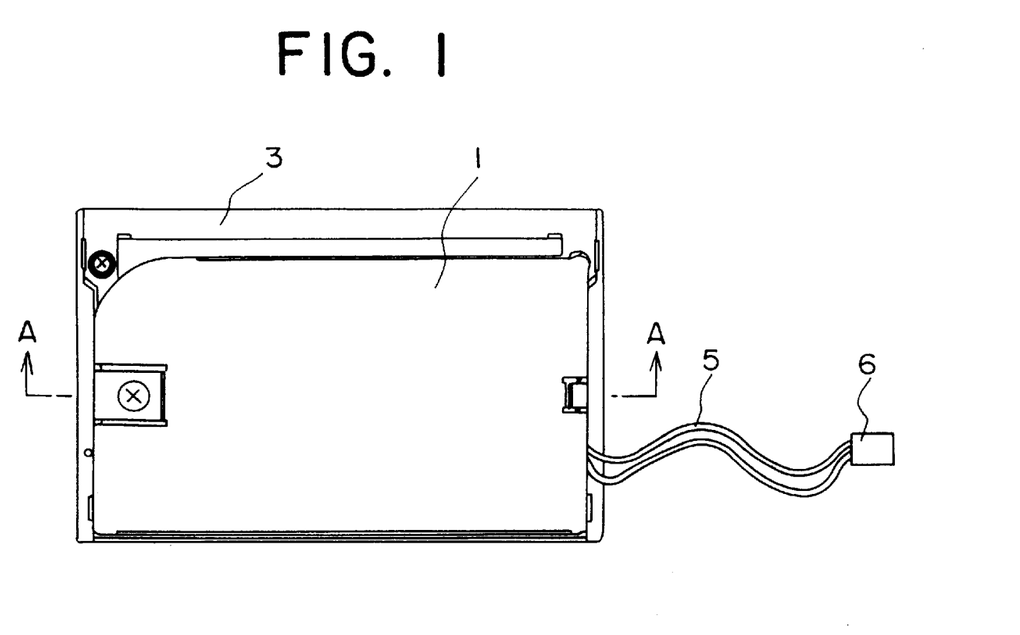
FIG. 1 is a plane view of an embodiment of the present invention.
Figure 2:
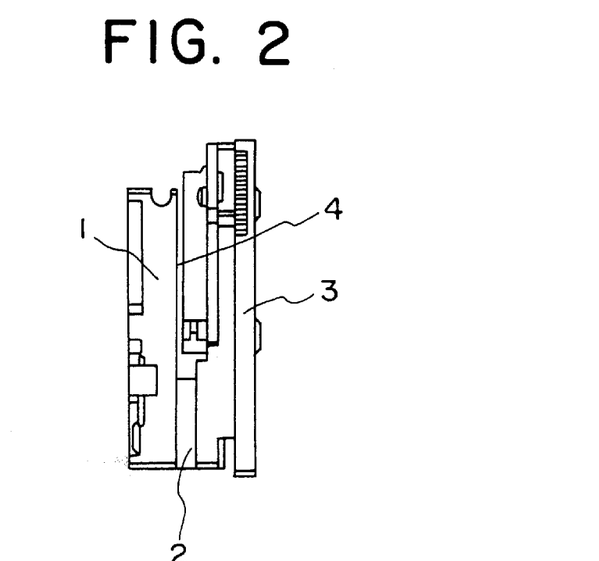
FIG. 2 is a right side view of the embodiment of the present invention.
Figure 3:
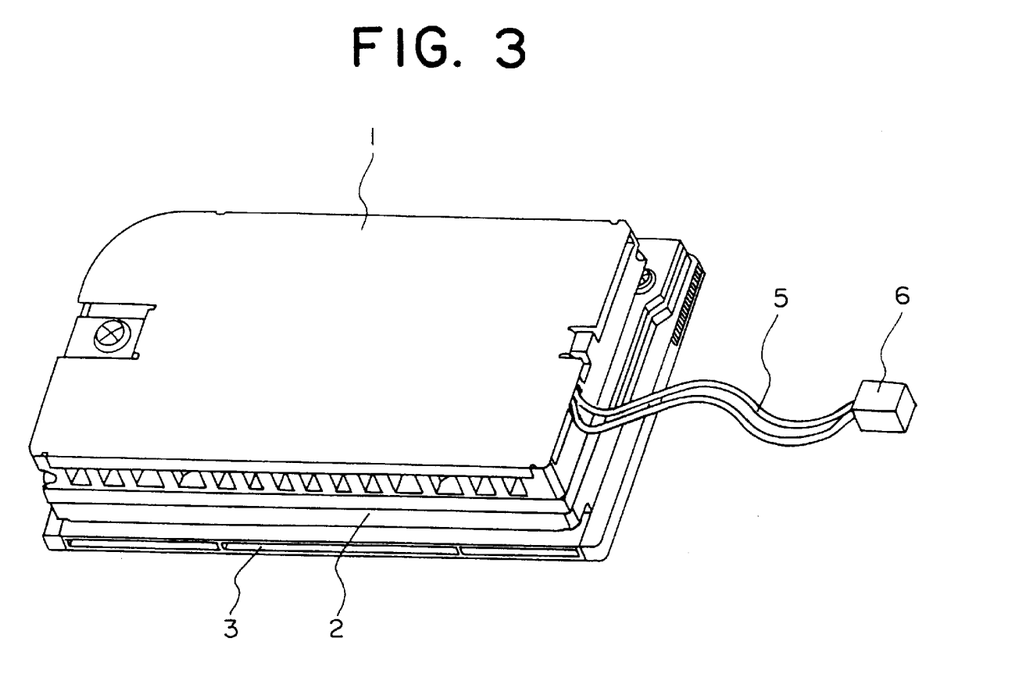
FIG. 3 is a perspective view of the embodiment of the present invention.

FIGS. 1 through 3 are respectively a plan view, a right side view, and a perspective view showing an embodiment of the present invention. As shown in FIGS. 1–3, a heat radiation device 1 is mounted on upper side of an electronic apparatus 3 via an intermediate block 2. Attachment of the intermediate block 2 to the electronic apparatus 3 and attachment of the heat radiation device 1 to the intermediate block 2 are performed through use of bolts which are screwed into bolt holes 20, which will be described later.

The intermediate block 2 is formed of a rectangular parallelepipedic aluminum block of a predetermined thickness. Therefore, heat from the electronic apparatus 3 is also transmitted to the heat radiation device 1 (to its base 7) via the intermediate block 2. Since the intermediate block 2 is used to adjust the distance between the electronic apparatus 3 and the heat radiation device 1, the thickness of the intermediate block 2 is adjusted appropriately. Although in FIG. 2 a small clearance is formed between the electronic apparatus 3 and the heat radiation device 1 in order to facilitate description, the clearance is actually decreased to zero such that direct contact is established between the electronic apparatus 3 and the heat radiation device 1. The above-described structure may be modified in such a way that the intermediate block 2 is omitted and the heat radiation device 1 is attached directly onto the electronic apparatus 3.

The electronic apparatus 3 is a thin-type electronic apparatus, such as a card-type personal computer (PC) or a motherboard including a processor and memory, which includes a heat generating element (not shown), such as a high performance processor, which consumes a large amount of electrical power. The heat generating element is a main heat source of the data processing apparatus. As is apparent from FIGS. 1 through 3, the electronic apparatus 3 is also formed to substantially the size of a credit card.

The heat radiation device 1 operates as follows. Heat generated from the heat source included in the electronic apparatus 3 is transmitted to the heat receiving portion 4 (a base 7, which will be described later), and the heat accumulated in the base 7 serving as the heat receiving portion 4 is radiated by means of cooling air that a built-in cooling fan 11 (see FIG. 4) causes to flow along a predetermined flow passage. The heat radiation device 1 is formed to have a size of 45 mm (shorter side)×80 mm (longer side)×8 mm (thickness); i.e., approximately the size of a credit card. The heat radiation device 1 is a heat sink equipped with the fan 11.

Lead wires 5 and a connector 6 are provided for a motor 10 (see FIG. 4), which drives the fan 11. The connector 6 is electrically connected to a terminal (not shown) of the motor 10 through which a drive signal is supplied to the motor 10. When a drive signal of a predetermined polarity is supplied to the motor 10, the motor 10 rotates in a predetermined direction. As a result, as will be described later, the fan 11 forces cooling air to flow in a predetermined direction within a flow passage provided within the heat radiation device 1.

Figure 4:
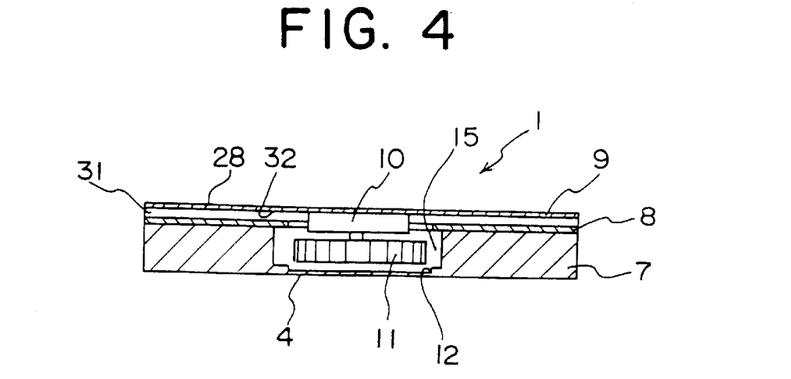
FIG. 4 is a schematic cross section of the heat radiation device 1, taken along line A—A in FIG. 1.

FIG. 4 is a schematic cross section of the heat radiation device 1, taken along line A—A in FIG. 1. As shown in FIG. 4, the heat radiation device 1 comprises the base 7 formed into a rectangular plate-like shape, an intermediate plate 8 formed into a rectangular shape, a cover 9 formed into a rectangular box-like shape, the motor 10, and the fan 11. The base 7, the intermediate plate 8, and the cover 9 are stacked, in this sequence, and each of the base 7, the intermediate plate 8, and the cover 9 is formed of a material of high heat conductivity. The motor 10 and the fan 11 are provided on the intermediate plate 8.

Figure 5:
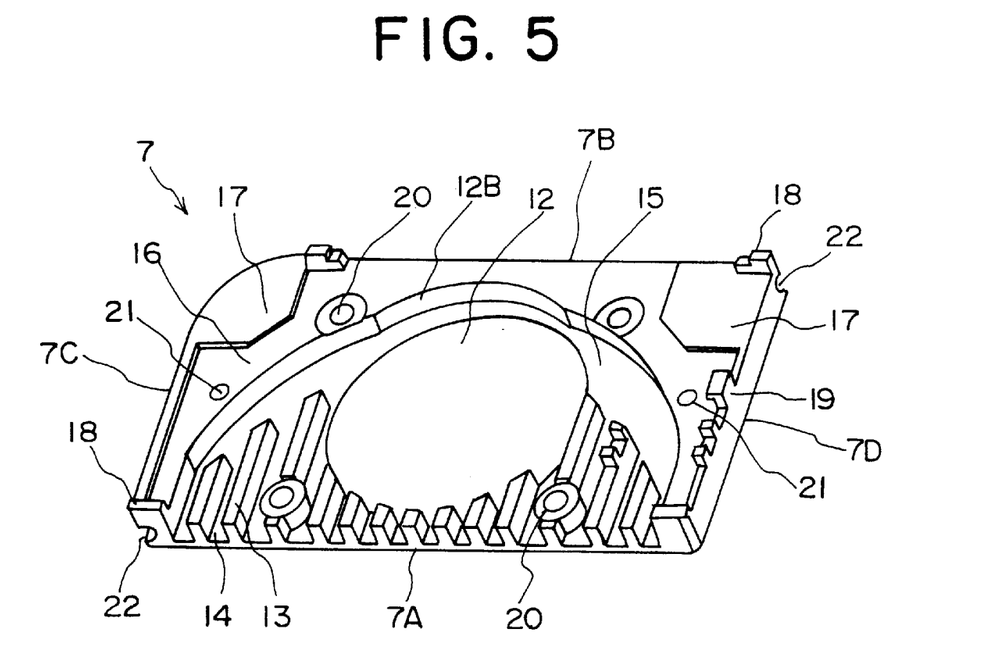
FIG. 5 is a perspective view of a base 7 shown in FIG. 4.

FIG. 5 is a perspective view of the base 7 shown in FIG. 4. The base 7 is formed of a material of high heat conductivity such as an aluminum alloy, and preferably is formed from a diecast aluminum alloy such as ADC12. The base 7 serves as the heat receiving portion 4 or a heat sink. As shown in FIG. 5, the base 7 has a depression 12, a plurality of fins 13, and a communication portion 15.

The depression 12 has a short cylindrical shape and is provided at a center portion of the base 7. The thickness of the bottom thereof is as small as, for example, 0.5 mm. The depression 12 is a main portion for radiating heat from the heat receiving portion 4. As shown in FIG. 4, the end surface of the fan 11 is substantially located within the depression 12. Through reduction of the thickness of the bottom wall of the depression 12, the heat radiation device 1 is prevented from becoming thick, and the heat accumulated in the heat receiving portion 4 and transmitted to the depression 12 can be efficiently transmitted to cooling air.

The plurality of fins 13 are projected vertically from the bottom wall of the base 7 such that the fins 13 are located along one longer side 7A of the base 7 and extend perpendicular to the longer side 7A. The plurality of fins 13 are formed so as to form a comb-like shape as a whole and are aligned parallel to one another. The plurality of fins 13 have different lengths. That is, as shown in FIG. 5, at the center portion, one end of each fin 13 is defined by the depression 12 in order to prevent the fins 13 from overlapping the depression 12, and at both side portions, one end of each fin 13 is defined in order to have the predetermined space to the communication portion 15. The other end of each fin 13 is aligned with the longer side 7A of the base 7. The fins 13 serve as heat radiation fins of the heat sink. The plurality of fins 13 (actually, the plurality of fins together with the intermediate plate 8) form a plurality of second ventilation ports 14 for cooling air. In this example, since the second ventilation ports 14 are used as discharge ports, in the following description the second ventilation ports 14 are referred to as the discharge ports 14. The number of the discharge ports 14 is one greater than the number of the fins 13.

As shown in FIG. 5, each of the fins 13 has a rectangular cross section. However, each of the fins 13 may have a trapezoidal shape in which the width of the upper end is smaller than the width of the lower end.

The communication portion 15 is formed such that its shape as projected onto a plane becomes arcuate. The communication portion 15 connects the depression 12 and the discharge ports 14 for establishing mutual communication therebetween. An arc formed by the communication portion 15 circumscribes a circle formed by the depression 12. The plurality of fins 13 are provided at the opening side of the communication portion 15 such that the fins 13 form slits (or partially close the opening). By employment of this structure, the flow passage for cooling air formed between the base 7 and the intermediate plate 8 is divided into a plurality of slits.

A cutaway portion 12B is provided at a side of the depression 12 opposite the fins 13 and has an arcuate shape as projected onto a plane. The cutaway portion 12B is an arcuate cutaway that is formed through partial removal of the arcuate wall of the communication portion 15. The wall surface of the cutaway portion 12B corresponds to an arc of a circle that has a greater diameter than and is concentric with the circle formed by the depression 12. Provision of the cutaway portion 12B enables smooth and spiral flow of cooling air in the vicinity of the fan (turbo fan) 11. Accordingly, efficient radiation of heat becomes possible without an accompanying increase of air resistance, which would otherwise occur upon passage of air through the communication portion 15.

A flat portion 16 of the base 7 is formed to be flush with the upper end portions of the fins 13 and has a profile that allows the intermediate plate 8 to be stacked thereon in a heat conductible manner. A stepped portion 17 is formed at each of the opposite corner portions of a longer side 7B of the base 7 opposite the longer side 7A and is used for positioning of the intermediate plate 8. That is, as can be seen from FIGS. 5 and 6, the intermediate plate 8 is fitted into a space formed on the base 7 by the stepped portions 17. The height of the stepped portion 17 with respect to the flat portion 16 corresponds to the thickness of the intermediate plate 8.

A positioning projection 18 is provided at each corner of the base 7, and an engagement projection 19 is provided at the center of one shorter side of the base 7. The positioning projections 18 and the engagement projection 19 are used in order to position the cover 9 on the base 7 in an engaged manner. The engagement projection 19 has an inverted L-like shape in order to establish engagement with an engagement portion 29 of the cover 9. The height of the projections 18 and 19 with respect to the flat portion 16 corresponds to the height of the cover 9; i.e., the height of projection of a side plate 28 of the cover 9. Four attachment bolt holes 20 are provided around the depression 12. Attachment bolts are inserted into the attachment bolt holes 20 in order to attach the base 7 to the electronic apparatus 3 (and the intermediate block 2) shown in FIGS. 1 through 3. Two threaded holes 21 are formed in areas outside the communication portion 15 such that one of the holes 21 is located at an approximate center of a shorter side 7C of the base 7 and the other hole 21 is located at an approximate center of a shorter side 7D of the base 7. The threaded holes 21 are used for attachment of the intermediate plate 8 (which will be described later) and the cover 9 to the base 7. Since the projections 18 and 19 and the holes 20 and 21 (other than the holes 20 located near the longer side 7A) are all provided outside the communication portion 15, they do not hinder flow of cooling air. Further, since the two holes 20 located near the longer side 7A are provided to be integral with the fins 13 and have a cylindrical wall, the two holes 20 hardly hinder flow of cooling air.

A groove 22 having a semi-circular or U-shaped cross section is formed in the base 7 along the shorter side 7C and the longer side 7B opposite the longer side 7A where the fins 13 are provided. Accordingly, as shown in FIG. 5, the groove 22 has a substantially L-like shape when projected on a plane. The groove 22 may be formed on the shorter side 7C, the longer side 7B, and the shorter side 7D in order to form a continuous U-shaped groove. As will be described later, a condensation portion of a heat pipe is accommodated within the groove 22 such that heat is conducted between the condensation portion and the base 7. The heat pipe is used to transfer to the base 7 heat from a heat source located away from the base 7. When no heat pipe is used, the groove 22 may be omitted.

Figure 6:
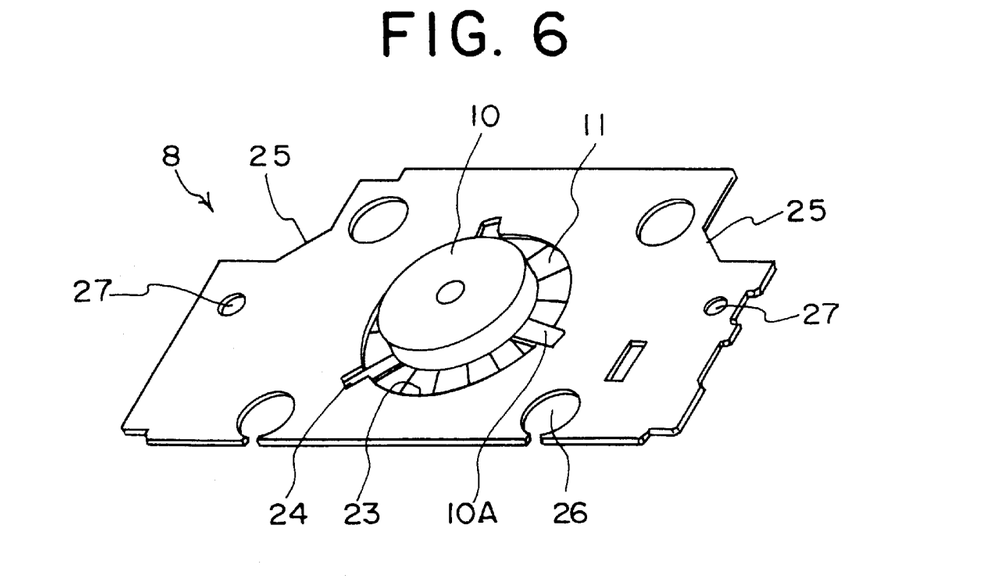
FIG. 6 is a perspective view of an intermediate plate 8 shown in FIG. 4.

FIG. 6 is a perspective view of the intermediate plate 8 shown in FIG. 4. The intermediate plate 8 shown in FIG. 6 is formed into a substantially rectangular shape from a plate of a material of high heat conductivity, such as A5052 aluminum alloy, and having a thickness of 0.8 mm. A circular opening 23 is formed in a center portion of the intermediate plate 8 at a position corresponding to the depression 12 shown in FIG. 5. Cutaway portions 24 are used for attachment of the motor 10. As shown in FIG. 6, mount portions 10A of the motor 10 are fitted into the cutaway portions 24.

Cutaway portions 25 are formed such that each cutaway has a shape, when projected on a plane, corresponding to the relevant stepped portion 17 shown in FIG. 5. Four attachment holes 26 are formed at positions corresponding to the attachment bolt holes 20, and two attachment holes 27 are formed at positions corresponding to the threaded holes 21. A packing or Mylar for attaining an airtight seal is attached to the attachment holes 26.

Figure 7:
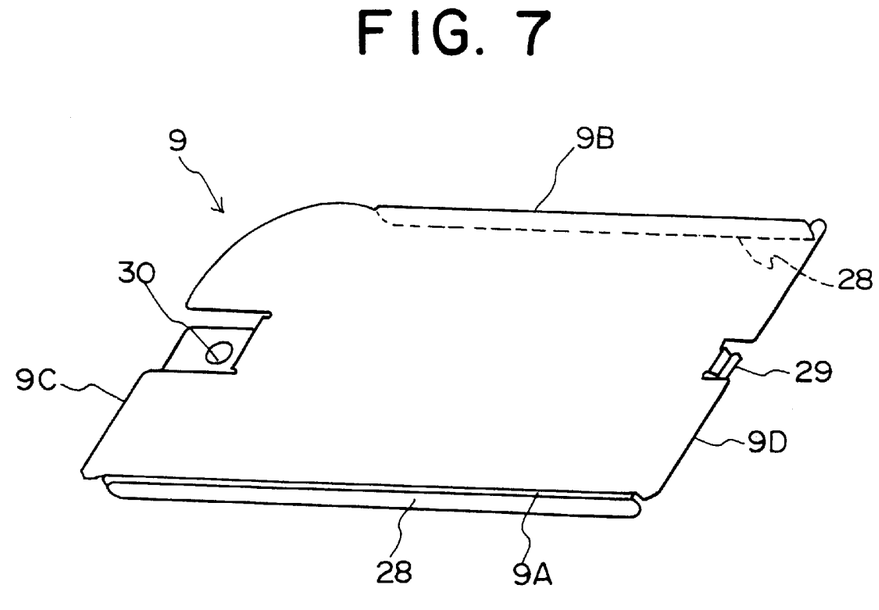
FIG. 7 is a perspective view of a cover 9 shown in FIG. 4.

FIG. 7 is a perspective view of the cover 9 shown in FIG. 4. The cover 9 shown in FIG. 7 is formed into a substantially rectangular box-like shape from a plate of a material of high heat conductivity, such as A5052 aluminum alloy, and having a thickness of 0.4 mm. A side plate 28 is integrally projected downward from each of the two longer sides 9A and 9B of the cover 9. The cover 9 is opened on the shorter sides 9C and 9D of the cover 9. An engagement portion 29 is provided at the approximate center of the short side 9C of the cover 9, and an attachment hole 30 is provided at the approximate center of the short side 9D of the cover 9. As shown in FIG. 3, the engagement portion 29 is fitted into the inner side of the engagement projection 19 of the base 7 in order to be engaged with the base 7. The hole 30, together with the attachment hole 27, is used for allowing screws to be screwed into the threaded holes 21 of the base 7.

The base 7, the intermediate plate 8, and the cover 9, which have the above-described structures, are stacked and assembled as shown in FIG. 4 in order to complete the heat radiation device 1.

First, when the intermediate plate 8 is attached to the base 7, the communication portion 15 serving as a (lower or discharge side) flow passage is formed between the base 7 and the intermediate plate 8. The opening 23 of the intermediate plate 8 serves as the inlet of the flow passage, and the second ventilation ports (discharge ports) 14 serve as the outlet of the flow passage. In the present embodiment, a plurality of fins 13 having the same height as the flat portion 16 are formed along the longer side 7A of the heat radiation device 1. Therefore, there are formed a plurality of slit-shaped discharge ports 14 each surrounded by adjacent fins 13 and the intermediate plate 8. The opening 23 and the discharge ports 14 are smoothly connected with each other via the communication portion 15.

Subsequently, when the cover 9 is attached to the intermediate plate 8, a (upper or intake side) flow passage 32 is formed between the cover 9 and the intermediate plate 8. The first ventilation port (intake port) 31 serves as the inlet of the flow passage 32, and the opening 23 serves as the outlet of the flow passage 32. In the present embodiment, the heat radiation device 1 is closed along the longer sides (7A, 7B, 9A, and 9B) by the side plates 28 of the cover 9, and at the shorter sides (7C, 7D, 9C, and 9D) of the heat radiation device 1 are formed a slit-shaped first ventilation port 31 and a flow passage 32, each having, for example, a height of 3.2 mm and a width of 45 mm, because each inside surface of the two side plates 28 of the cover 9 abut the intermediate plate 8 and the base 7. In the present embodiment, since the first ventilation port 31 is used as an intake port, in the following description the first ventilation port 31 is referred to as the intake port 31.

The fan 11 equipped with the motor 10 is provided at the opening 23, which connects the intake-side flow passage 32 and the discharge-side flow passage (the communication portion 15). Accordingly, when the fan 11 is driven in a predetermined direction (for example, in the counterclockwise direction) by the motor 10, cooling air is introduced from the intake port 31 and is caused to flow within the flow passage 32 along the longer sides 9A and 9B toward the opening 23. Subsequently, after the flow direction is changed by the fan 11, the cooling air is forced to pass through the depression 12 and the communication portion 15 shown in FIG. 5, and is then discharged from the discharge ports 14 formed by the fins 13 and the intermediate plate 8. Thus, heat accumulated within the base 7 via the heat receiving portion 4 is discharged to the outside.

The fan 11 may be a well-known axial-flow fan or a turbo fan. A turbo fan produces a smaller amount of loss due to air resistance as compared with an axial-flow fan, and is suitable for size reduction. Therefore, in the present embodiment, a turbo fan is used as the fan 11. At the opening 23 of the intermediate plate 8, the fan 11 causes cooling air to flow from the intake port (the first ventilation port) 31 to the discharge ports (the second ventilation ports) 14 such that the cooling air first flows along a flow passage formed between the cover 9 and the intermediate plate 8 and then flows along a flow passage substantially perpendicular to the first flow passage toward the discharge ports (the second ventilation ports) 14. Employment of this structure enables the flow passage for cooling air to be bent at a substantially right angle, without increasing air resistance very much.

When a turbo fan is used, the depression 12 is formed in the base 7 to have an inner diameter about 30% greater than the outer diameter of the fan 11. In addition, the above-described cutaway portion 12B is provided. Thus, a swirl of cooling air formed along a circle slightly larger than the periphery of the fan (turbo fan) 11 is prevented from becoming turbulent in order to reduce resistance and noise, which would otherwise be produced upon passage of cooling air. Further, since the communication portion 15 which connects the depression 12 and the discharge port 14 has an approximate arcuate shape, cooling air is guided smoothly from the depression 12 toward the discharge port 14, so that the flow hardly becomes turbulent. Consequently, the flow speed can be increased quickly.

Since in the present embodiment the cover 9 is provided upstream of the fan 11, the air resistance as viewed from the fan 11 is considered to increase with a resultant decrease in heat radiation efficiency. However, in practice, the heat radiation efficiency in the case where the cover 9 is provided is higher than that in the case where the cover 9 is not provided, because attachment of the cover 9 increases the flow speed of cooling air to thereby increase the heat absorbing efficiency, although the total flow rate of cooling air is decreased (air resistance is increased).

In the present embodiment, since the discharge ports 14 are provided along only the longer side 7A, the air resistance of the flow passage is considered to increase with a resultant decrease in heat radiation efficiency. However, in practice, the heat radiation efficiency in the case where the discharge ports 14 are provided along only the longer side 7A is higher than that in the case where the discharge ports 14 are provided along each of the longer sides 7A and 7B, because the flow speed of cooling air increases with a resultant increase in heat absorbing efficiency, although the total flow rate of cooling air decreases (air resistance increases). Especially, decreasing the width of the effective opening of a single set of discharge ports 14 is a more effective measure for increasing the flow speed of cooling air than is decreasing the width of the effective opening of the two intake ports 31. Further, when the discharge ports 14 are provided along each of the longer sides 7A and 7B, discharged air returns to the intake port 31. Accordingly, returning of discharged air can be prevented when the position and number of the discharge ports 14 are restricted in the above-described manner.

In the present embodiment, since the fins 13 are provided at the discharge ports 14, the air resistance of the flow passage is considered to increase with a resultant decrease in heat radiation efficiency. However, in practice, the heat radiation efficiency in the case where the fins 13 are provided is higher than that in the case where the fins 13 are not provided, because the contact area between cooling air and the base 7 increases and the flow speed of the cooling air increases further with a resultant increase in heat absorbing efficiency. Since the flow passage shown in FIG. 4 is divided into slit-shaped passages, the flow speed of cooling air can be increased. Further, since the intermediate plate 8 and the base 7 are connected in a heat conductible manner and the base 7 and the intermediate plate 8 are formed into a rectangular shape, the area of heat transfer can be increased. Thus, the heat within the base 7 can be efficiently transmitted to the intermediate plate 8. Therefore, heat exchange between the heat radiation device and cooling air is promoted with a resultant increase in cooling efficiency.

Figure 8:
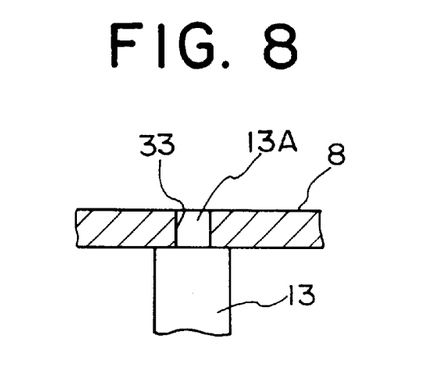
FIG. 8 is an enlarged sectional view of a main portion showing an example of means for improving heat conduction between the base 7 and the intermediate plate 8.

FIG. 8 is an enlarged sectional view of a main portion of the heat radiation device, showing an example of means for improving heat conduction. As shown in FIG. 8, an insertion hole 33 is formed in the intermediate plate 8 as means for improving heat conduction between the base 7 and the intermediate plate 8. An insertion portion 13A provided at the upper end of the fin 13 is fitted into the insertion hole 33. In this case, fitting engagement may be established between only a fraction of the fins 13 and the intermediate plate 8. This structure enables heat within the base 7 to be transmitted more smoothly to the intermediate plate 8, leading to an expected further increase in cooling efficiency.

Figure 9:
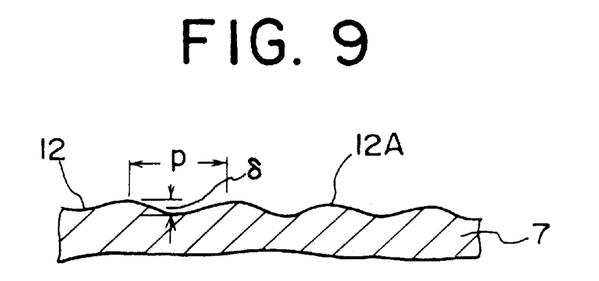
FIG. 9 is an enlarged sectional view of the main portion showing an example of means for improving cooling efficiency.

FIG. 9 is an enlarged sectional view of a main portion of the heat radiation device, showing an example of means for improving cooling efficiency. As shown in FIG. 9, a wavy shape 12A may be formed on the surface (inside bottom surface) of the depression 12; i.e., on the surface that faces the fan 11 shown in FIG. 4, such that the wavy shape extends in a direction intersecting the flow direction of cooling air. In this case, the height difference 6 between the top and bottom of the wavy shape 12A is about 20% the clearance between the end surface of the fan 11 and the surface of the depression 12. That is, when the clearance is 500 μm, the height difference 6 is preferably set to about 100 μm, and the pitch p between waves is preferably set to about 4 to 5 mm. Due to this configuration, a pressure difference is produced in cooling air flowing along the surface of the depression 12 opposite the fan 11 with a resultant increase in flow speed, and the efficiency in cooling the base 7 is improved. When the height difference 6 is considerably smaller than 20% the clearance, flow speed cannot be increased sufficiently. When the height difference 8 is considerably larger than 20% the clearance, air resistance increases substantially, so that flow speed cannot be increased sufficiently.

Figure 10:
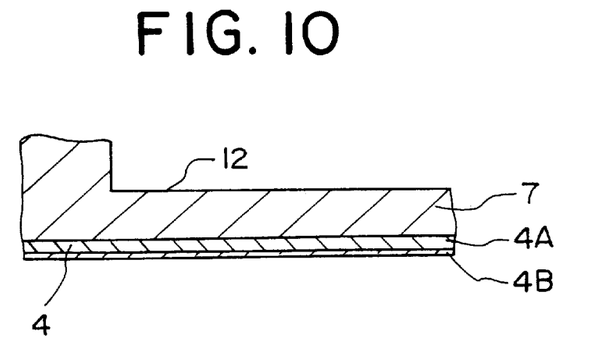
FIG. 10 is an enlarged sectional view of the main portion showing another example of the means for improving cooling efficiency.

FIG. 10 is an enlarged sectional view of a main portion of the heat radiation device, showing another example of means for improving cooling efficiency. The heat radiation device of the present invention is naturally required to have a reduced thickness for application to the thin electronic apparatus 3. Accordingly, in order to improve cooling efficiency and heat radiation efficiency, heat transfer surfaces and/or cooling-air contact surfaces of the base 7 and the intermediate plate 8, which are constituent members, are preferably coated with a thin film of a material of high heat conductivity and having a thickness of a few tens of microns. As shown in FIG. 10, at least the heat receiving portion 4 of the base 7 (see FIGS. 2 and 4) is preferably coated with a thin film of a material of high heat conductivity. Examples of such a material include Cu (heat conductivity: 390 W/m·K) and diamond (heat conductivity: 1000 W/m·K). The thin film preferably has a thickness of a few tens of microns.

Specifically, as shown in FIG. 10, a copper layer 4A of 50 μm thickness is formed through plating on the outer surface of the bottom wall (serving as the heat receiving portion 4) of the base 7, and the copper layer 4A is coated with a thinner nickel layer 4B through plating. Instead of plating copper, a copper foil 4A of 50 μm thickness may be applied under pressure.

Figure 11:
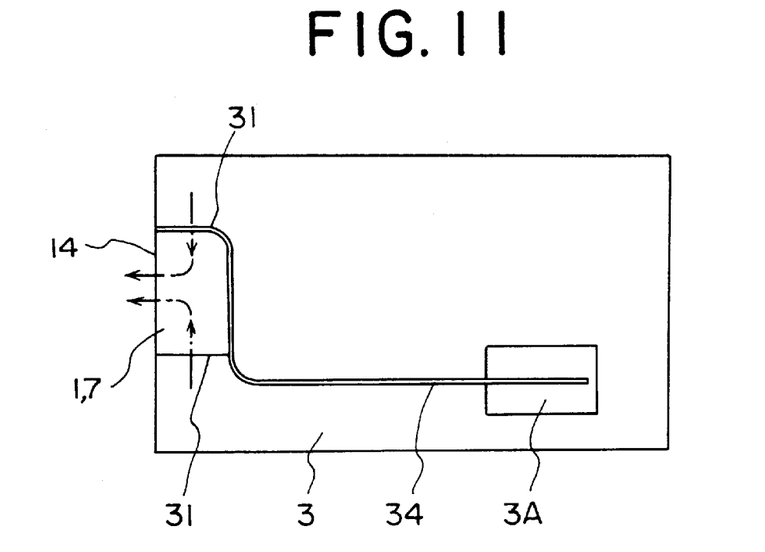
FIG. 11 is an explanatory plan view of another embodiment of the present invention.
Figure 12:
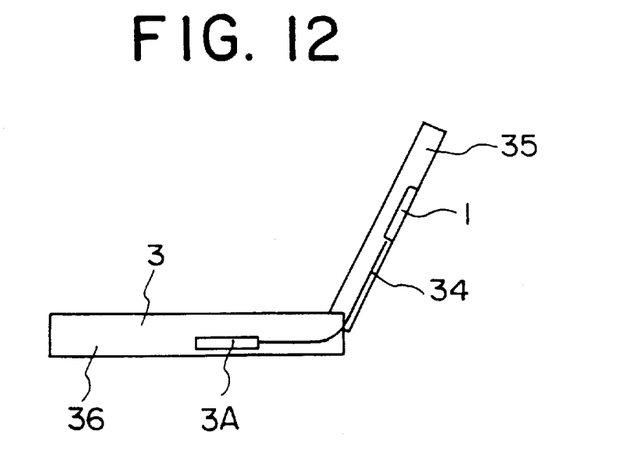
FIG. 12 is an explanatory side view of the embodiment of FIG. 11.

FIGS. 11 and 12 are a plan view and a side view showing another embodiment of the present invention. The same portions as shown in FIGS. 1 to 3 are denoted by the same reference symbols. In FIG. 11, a heat pipe 34 is a hollow cylindrical tube which has a wick layer on the inner surface and whose opposite ends are closed. In the heat pipe 34, a condensable liquid such as ethanol or water sealed therein permeates the wick layer by capillary action. The evaporation portion of the heat pipe 34 is connected to the heat source 3A of the electronic apparatus 3 in a heat conductible manner, and the condensation portion of the heat pipe 34 is connected to the heat radiation device 1 in a heat conductible manner.

The heat pipe 34 has an outer diameter of, for example, 2 to 3 mm, and the condensation portion of the heat pipe 34 is accommodated within the groove 22 shown in FIG. 5. Accordingly, the heat pipe 34 is bent into a generally L-like shape along the heat radiation device 1. In the heat radiation device 1 of FIG. 11, when heat is applied to the evaporation portion connected to the heat source 3A in a heat conductible manner, liquid evaporates within the wick layer of the heat pipe 34, and the thus-formed vapor moves within the heat pipe 34 and reaches the condensation portion connected to the heat radiation device 1. At the condensation portion, heat is removed from the vapor so that the vapor becomes liquid, which is returned along the wick layer to the evaporation portion by capillary action. The arrows in the heat radiation device 1 indicate the flow direction of cooling air. Cooling air flows from the two intake ports 31 at the two shorter sides to the discharge ports 14 at one longer side and cools the base 7 which has been heated by means of heat transfer from the heat pipe 34.

The above-described structure enables cooling of a heat source 3A located away from the heat radiation device 1. Therefore, even when a space for installing the heat radiation device 1 cannot be secured above the heat source 3A, the heat source 3A can be cooled. Further, it becomes possible to avoid an undesirable increase in the overall thickness of the electronic apparatus 3, which would otherwise occur upon installation of the heat radiation device 1 directly above the heat source 3A.

FIG. 12 shows an example in which the structure shown in FIG. 11 is applied to a laptop personal computer. A heat source 3A is disposed within an electronic apparatus 3, and a heat radiation device 1 is disposed within an LCD section 35, which can be opened and closed. The heat source 3A is connected via a heat pipe 34 to the heat radiation device 1 in a heat conductible manner. This structure is advantageous in that the thickness of a keyboard section 36 of the electronic apparatus 3 and thus the overall thickness of the apparatus are not affected by installation of the heat radiation device 1 and that heat generated from the heat source 3A can be efficiently discharged to the outside.

It is to be noted that the electronic apparatus 3 shown in FIG. 11 is a printed circuit board of the laptop personal computer shown in FIG. 12, and various semiconductor devices, including the heat source 3A such as a CPU, are mounted on the printed circuit board. The printed circuit board or the electronic apparatus 3 is accommodated within the keyboard section 36 of the laptop personal computer shown in FIG. 12. This is an example in which the heat source 3A and the heat radiation device 1 are mounted separately within the keyboard section 36. Employment of this structure can reduce the thickness of the keyboard section 36 and thus the overall thickness of the laptop personal computer.

The embodiments shown in FIGS. 11 and 12 preferably employ a structure in which cooling air discharged from the discharge ports 14 of the heat radiation device 1 is discharged directly to the outside of the electronic apparatus 3. That is, as shown in FIG. 11, the heat radiation device 1 is advantageously disposed at an end portion of the electronic apparatus 3 (the keyboard section 36). Alternatively, as shown in FIG. 12, the heat radiation device 1 is advantageously disposed in direct contact with the wall surface of the electronic apparatus 3. In these cases, when a ventilation opening is formed in the housing of the electronic apparatus 3 at a position corresponding to the ventilation port of the heat radiation device 1, cooling air can be discharged directly to the outside of the electronic apparatus 3 to thereby further increase the cooling efficiency.

In the embodiments of the present invention, the comb-shaped fins 13 each having a width of, for example, 1.8 mm are disposed at the discharge port 14. However, instead of the fins 13, a plurality of cylindrical pins may be provided. These pins may be disposed not only at the discharge port 14 but also at the communication portion 15 shown in FIG. 5. In this case, the cooling efficiency can be further improved.

INDUSTRIAL APPLICABILITY

In the heat radiation device for a thin electronic apparatus according to the present invention, a flow passage and a fan are provided in order to enable the heat radiation device itself to forcibly induce a flow of cooling air. Therefore, it becomes possible to efficiently draw in and discharge heat generated from a thin electronic apparatus including a heat source such as a high performance CPU, which consumes a large amount of electrical power and generates a large amount of heat.

Further, the entire heat radiation device is formed into a thin rectangular card-like shape; an intake port is provided at either shorter side; and a discharge port is provided at one longer side. Therefore, the flow speed of cooling air can be increased, and returning of discharged air to the intake ports can be prevented, whereby cooling efficiency is improved.

Since heat from a heat source is transferred not only to the base but also to the intermediate plate, among the base, the intermediate plate and the cover, which are constituting a three-layer structure, the area of contact with cooling air can be increased in order to improve cooling efficiency.

Further, heat generated at a remote heat source is transferred via a heat pipe to the heat radiation device to be cooled thereby. Therefore, even when the heat radiation device is installed in an electronic apparatus, the overall thickness of the electronic apparatus does not increase. Therefore, the heat radiation device contributes to reduction in thickness of the electronic apparatus.

What is claimed is:

1. A heat radiation device for a thin electronic apparatus, comprising:
   a rectangular plate-shaped base comprising a material having high heat conductivity;
   a rectangular intermediate plate formed from a material having high heat conductivity and stacked on said base;
   a rectangular box-shaped cover stacked on said intermediate plate; and
   a fan,
   wherein said base comprises a depression having a short cylindrical shape at a center portion of said base, a plurality of parallel fins projecting from a bottom portion of said base along a first longer side thereof such that said fins extend in a direction perpendicular to the first longer side, said intermediate plate and said plurality of parallel fins forming a second ventilation port, and a communication portion having an arcuate shape as projected on a plane connecting said depression and said second ventilation port,
   said intermediate plate comprises a circular opening at a position corresponding to that of said depression, and said fan is attached to said intermediate plate such that said fan is at a position of the circular opening,
   said intermediate plate and said base are connected together such that heat can be conducted therebetween,
   said cover comprises downwardly projecting side plates respectively provided at each longer side of said cover, a surface of respective side plates abutting said intermediate plate and/or said base forming a first ventilation port for cooling air at a shorter side of said cover, and forming a passage for cooling air between said cover and said intermediate plate, and
   wherein operation of said fan causes cooling air to flow between said first and second ventilation ports, so that heat accumulated within said base is radiated to the outside.

2. A heat radiation device, comprising:
   a base comprising a material having high heat conductivity, said base having a substantially rectangular plate-shape, a depression, a plurality of parallel fins and a communication portion, said depression having a short cylindrical shape and formed at a center portion of said base, said plurality of parallel fins projecting from a bottom portion of said base and provided along a first longer side thereof and extending in a direction perpendicular to said first longer side, and said communication portion having an arcuate shape as projected on a plane, said arcuate shape substantially circumscribing said depression opposite to said plurality of parallel fins, and said plurality of parallel fins being provided at an opening of said arcuate shape so as not to overlap said depression;
   an intermediate plate comprising a material having high heat conductivity, said intermediate plate having a substantially rectangular shape and a circular opening which is formed at a position corresponding to that of said depression, and being stacked on and connected to said base such that heat can be conducted therebetween;
   a cover having a substantially rectangular and box-shape, being stacked on said intermediate plate, and having two downwardly projecting side plates which are provided at each longer side of said cover, each inside surface of said side plates being abutted onto said intermediate plate and said base; and
   a fan fixed to said intermediate plate so as to place said fan at a position of said circular opening and so as to flow cooling air from one side of said intermediate plate to another side,
   wherein a second ventilation port is formed at said first longer side by said base and said intermediate plate and comprises a plurality of slits divided by said plurality of parallel fins, and said communication portion connects said depression and said second ventilation port;

wherein a first ventilation port and a passage for cooling air are formed by said cover including said two side plates and said intermediate plate, said first ventilation port being formed at two shorter sides of said cover; and wherein said fan causes cooling air to flow between said first and second ventilation ports so as to radiate heat accumulated within said base to outside of said heat radiation device by operation of said fan.

3. A heat radiation device according to claim 2, wherein said first and second ventilation ports are used as an intake port and a discharge port, respectively, and cooling air is caused to flow from said first ventilation port to said second ventilation port by operation of said fan.

4. A heat radiation device according to claim 3, wherein a bottom surface is used as a heat receiving portion and is disposed above a heat source so as to face said heat source.

5. A heat radiation device according to claim 4, wherein said bottom surface is covered with a thin film of a material of high heat conductivity.

6. A heat radiation device according to claim 5, wherein at least said base is formed of an aluminum alloy, and said thin film is formed of at least copper.

7. A heat radiation device according to claim 3 further comprising:

a heat pipe having at least a condensation portion and an evaporation portion;

wherein said base has a groove having a semi-circular or U-shaped cross section and being formed along a shorter side and a second longer side of said base; and wherein said condensation portion of said heat pipe is accommodated within said groove in a heat conductible manner, and said evaporation portion of said heat pipe is connected to a heat source in a heat conductible manner.

8. A heat radiation device according to claim 7, wherein said evaporation portion of said heat pipe is connected to an electronic apparatus which is a heat source and is provided at a position separated from said heat radiation device.

9. A heat radiation device according to claim 3, wherein said intermediate plate has a plurality of insertion holes; and wherein each of said plurality of fins has an insertion portion at an upper end, each of said insertion portions being fitted into a corresponding hole of said insertion holes.

10. A heat radiation device according to claim 3, wherein said base has a wavy shape formed on a surface of said depression, said wavy shape extending in a direction intersecting a direction of said flow of cooling air caused by said fan.

11. A heat radiation device according to claim 10, wherein said wavy shape has a difference of height between a top and bottom of said wavy shape, said difference being substantially 20% of a clearance between an end surface of said fan and a surface of said depression.

12. A heat radiation device according to claim 3, wherein said communication portion of said base includes a cutaway portion having an arcuate shape as projected on a plane and being formed by partial cut of an arcuate wall of said communication portion on a side opposite said fins.

13. A heat radiation device according to claim 3, wherein said fan is formed of a turbo fan and causes said cooling air to flow from said first ventilation port to said second ventilation port along first and second flow passages, said first flow passage being formed between said cover and said intermediate plate, and said second flow passage being bent toward said second ventilation port at a substantially right angle at said opening of said intermediate plate.

* * * * *